US012716963B2

(12) United States Patent
Daenzer et al.

(10) Patent No.: US 12,716,963 B2
(45) Date of Patent: Aug. 25, 2026

(54) POWER COMPONENT AND SYSTEM WITH THE POWER COMPONENT

(71) Applicant: ABB Schweiz AG, Baden (CH)

(72) Inventors: Jonas Daenzer, Untersiggenthal (CH); Ralf Baechle, Weilheim (DE)

(73) Assignee: ABB SCHWEIZ AG, Baden (CH)

( * ) Notice: Subject to any disclaimer, the term of this patent is extended or adjusted under 35 U.S.C. 154(b) by 723 days.

(21) Appl. No.: 17/906,167

(22) PCT Filed: Feb. 12, 2021

(86) PCT No.: PCT/EP2021/053416
§ 371 (c)(1),
(2) Date: Sep. 12, 2022

(87) PCT Pub. No.: WO2021/180419
PCT Pub. Date: Sep. 16, 2021

(65) Prior Publication Data

US 2023/0160978 A1 May 25, 2023

(30) Foreign Application Priority Data

Mar. 11, 2020 (EP) .................................... 20162452

(51) Int. Cl.
*G01R 31/74* (2020.01)
*H01H 85/02* (2006.01)
(Continued)

(52) U.S. Cl.
CPC ......... *G01R 31/74* (2020.01); *H01H 85/0241* (2013.01); *H02M 1/327* (2021.05);
(Continued)

(58) Field of Classification Search
CPC ........ Y04S 10/30; Y04S 10/18; Y04S 40/126; H02M 1/32; H02M 1/327; H02M 7/003;
(Continued)

(56) References Cited

U.S. PATENT DOCUMENTS 3,633,191 A * 1/1972 Engelhardt ............ G01K 1/024
374/E1.004
2005/0285228 A1 12/2005 Sugawara
(Continued)

FOREIGN PATENT DOCUMENTS

CN 204008933 U 12/2014
GB 2007431 A 5/1979
(Continued)

OTHER PUBLICATIONS

European Search Report; Application No. 20162452.5; Issued: Sep. 29, 2020; 12 Pages.

(Continued)

*Primary Examiner* — Dionne Pendleton
(74) *Attorney, Agent, or Firm* — Greenberg Traurig, LLP

(57) ABSTRACT

A power component includes two electric terminals, a component housing, a main component at least partially surrounded by the component housing, connected with the two terminals, and configured to carry a power current flowing between the two electric terminals, and a sensor and emitter unit which is configured to measure a value of a physical quantity (T, V, ΔV) characterizing an operating state of the main component, and to emit an electromagnetic signal, in which the measured value of the physical quantity is encoded. The sensor and emitter unit includes an antenna for emitting the electromagnetic signal which is spaced apart from the main component and arranged in, on and/or at the component housing.

20 Claims, 3 Drawing Sheets

(51) Int. Cl.

*H02M 1/32* (2007.01)
*H02M 7/00* (2006.01)
*H10W 40/00* (2026.01)
*H10W 42/80* (2026.01)
*H10W 76/15* (2026.01)

(52) U.S. Cl.

CPC .......... *H02M 7/003* (2013.01); *H10W 40/00* (2026.01); *H10W 42/80* (2026.01); *H01H 2085/0266* (2013.01); *H01H 2085/0283* (2013.01); *H10W 76/15* (2026.01)

(58) Field of Classification Search

CPC ............ H02M 1/0006; H02M 1/0009; H02M 1/04095; H02M 1/081; H02M 7/1557; H02M 7/217; H02M 7/4835; H02M 7/4837; H02M 7/487; Y02E 60/00; Y02E 40/60; Y02E 60/10; H02J 13/00002; H02J 7/0047; H02J 7/345; H02J 13/1335; H02J 13/333; H02J 13/34; H02J 13/36; H02H 3/044; H02H 3/08; H02H 3/066; H02H 3/335; H02H 5/041; H02H 7/1225; H02H 9/041; H02H 1/0007; H02H 1/0023; H02H 1/0061; H02H 3/00; H02H 3/006; H02H 3/025; H02H 3/04; H02H 3/046; H02H 3/05; H02H 3/093; H02H 3/10; H02H 3/16; H02H 3/20; H02H 3/207; H02H 3/32; H02H 3/334; H02H 3/38; H02H 5/042; H02H 5/048; H02H 5/105; H02H 7/22; H02H 7/26; H02H 9/00; H02H 9/001; H01L 23/051; H01L 23/053; H01L 23/34; H01L 23/5256; H01L 23/62; H01L 25/115; H01L 2224/48091; H01L 2224/48247; H01L 23/53285; H01L 2924/00; H01L 2924/00012; H01L 2924/00014; H01L 2924/01015; H01L 2924/01047; H01L 2924/10253; H01L 2924/10329; H01L 2924/1305; H01L 2924/13091; H01L 2924/1461; H01L 2924/181; H01L 2924/30107; H01L 2924/3011; H01L 2924/3025; H01H 2085/0266; H01H 2085/0283; H01H 85/0241; H01H 9/54; H01H 33/14; H01H 33/36; H01H 33/59; H01H 85/204; H01H 85/30; H01H 85/306; H01H 85/56; H01H 1/14; H01H 1/20; H01H 2009/544; H01H 2009/546; H01H 2037/705; H01H 21/165; H01H 2223/002; H01H 3/02; H01H 37/002; H01H 37/521; H01H 37/70; H01H 37/74; H01H 50/021; H01H 50/546; H01H 69/00; H01H 71/04; H01H 83/02; H01H 85/042; H01H 85/12; H01H 85/157; H01H 85/165; H01H 89/00; H01H 89/06; H01H 89/08; H01H 9/102; H01H 9/302; H01H 9/32; H01H 9/36; H01H 9/46; H01H 9/542; G01R 31/74; G01R 33/0354; G01R 31/3835; G01R 31/396; A61B 2560/0219; A61B 2560/0271; A61B 2560/0412; A61B 2560/0468; A61B 2562/0219; A61B 2562/028; A61B 5/002; A61B 5/14552; A61B 5/4035; A61B 5/6825; A61B 5/6826; A61B 5/6838; Y10S 128/903; H03F 3/45103; H03F 3/19; H03F 1/0211; H03F 1/0222; H03F 1/56; H03F 2200/451; H03F 3/245; H03F 3/68; H03F 2200/294; H03F 3/189; C04B 35/45; G01K 7/006; G01K 1/024; G01K 1/028; G01K 1/14; G01K 2207/06; G01K 2215/00; G01K 7/021; G01K 7/18; G01K 7/24; G01K 7/25; G01K 7/42; G01L 21/12; H01B 1/00; H01F 6/06; H01F 38/32; H02K 3/02; H02K 55/00; H10N 60/124; H10N 60/203; H10N 60/857; H10N 60/858; H01Q 1/243; H01Q 3/28; H01Q 3/38; H01Q 1/24; H01Q 1/38; H01Q 1/44; H01Q 13/02; H01Q 13/10; H01Q 21/205; H01Q 5/335; H01Q 5/35; H01Q 5/357; H01Q 5/371; H01Q 9/42; G01S 13/931; G01S 2013/0245; G01S 7/032; G01S 7/282; G01S 7/4013; H05K 9/00; H05K 1/0254; H05K 1/117; H05K 2201/09145; H05K 2201/10151; H05K 2203/168; H04L 12/2825; H04L 2012/2841; H04L 2012/2843; H01M 10/425; H01M 10/48; H01M 10/482; H01M 2010/4271; H01M 2220/20; H01M 50/103; H01M 50/119; H01M 50/548; H01M 50/55; H01M 50/569; G08B 15/00; G08B 19/005; G08B 25/10; G08B 25/14; G06K 19/0717; G01D 3/028; G01D 5/202; G01B 7/14; Y02D 30/70; H04B 1/006; H04B 1/10; H04B 1/1027; H04B 1/18; H04B 10/807; H04B 15/00; H04B 7/18506; H03M 1/18; H03G 3/3036; Y02B 70/10; H02P 27/047; H02P 29/02; H01R 12/721; H01R 13/642; H01R 13/645; H01R 13/6456; H01C 7/12; G06F 1/26; H03K 17/08; H03K 17/567

See application file for complete search history.

(56) References Cited

U.S. PATENT DOCUMENTS

| | | | | |
|---|---|---|---|---|
| 2006/0103449 | A1* | 5/2006 | Watanabe ................ | G01K 7/01<br>327/512 |
| 2008/0231410 | A1 | 9/2008 | Doljack et al. | |
| 2009/0079572 | A1* | 3/2009 | Atsumi ............. | G06K 19/0708<br>340/572.1 |
| 2011/0309893 | A1* | 12/2011 | Kawamura ............. | H01L 23/48<br>257/E31.001 |
| 2012/0182094 | A1* | 7/2012 | Kawamura .............. | H01Q 1/24<br>333/239 |
| 2018/0013048 | A1* | 1/2018 | Insanic ................ | H10N 10/852 |
| 2020/0051768 | A1 | 2/2020 | Moebis et al. | |
| 2020/0161988 | A1 | 5/2020 | Sakai et al. | |
| 2021/0226437 | A1* | 7/2021 | Lichauer ................ | H02H 3/025 |

FOREIGN PATENT DOCUMENTS

| | | | |
|---|---|---|---|
| JP | 2005033199 | A | 2/2005 |
| JP | 2006108256 | A | 4/2006 |
| JP | 2016522987 | A | 8/2016 |
| JP | 2017518051 | A | 7/2017 |
| JP | 2018518051 | A | 7/2018 |
| JP | 2019135819 | A | 8/2019 |
| KR | 1020090037382 | A | 4/2009 |
| WO | 2005020320 | A1 | 3/2005 |
| WO | 2014173550 | A1 | 10/2014 |
| WO | 2015110235 | A1 | 7/2015 |
| WO | 2017078525 | A1 | 5/2017 |

(56) References Cited

FOREIGN PATENT DOCUMENTS

| | | | |
|---|---|---|---|
| WO | 2019016949 | A1 | 1/2019 |
| WO | 2021180419 | A1 | 9/2021 |

OTHER PUBLICATIONS

PCT International Search Report and Written Opinion of the International Searching Authority; Application No. PCT/EP/2021/053416; Completed: Jul. 23, 2021; Mailing Date: Aug. 2, 2021; 24 Pages.

Indian Search Report; Application No. 202247054243; Issued: Jan. 20, 2023; 4 Pages.

Second Chinese Office Action; Application No. 3,171,221; Issued: Oct. 7, 2025; 5 Pages.

* cited by examiner 100
111
120
120
110
135
133
130
112
135'

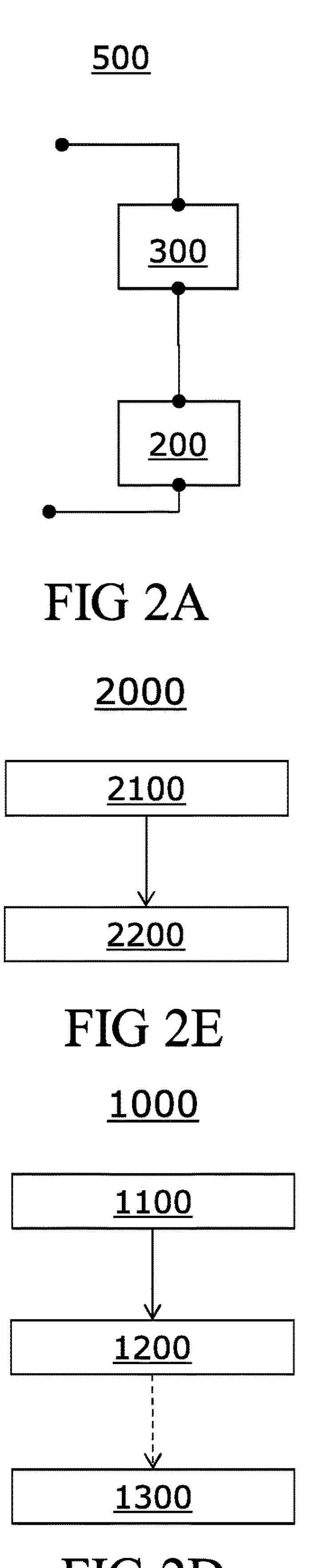
FIG 2A
FIG 2E
FIG 2D
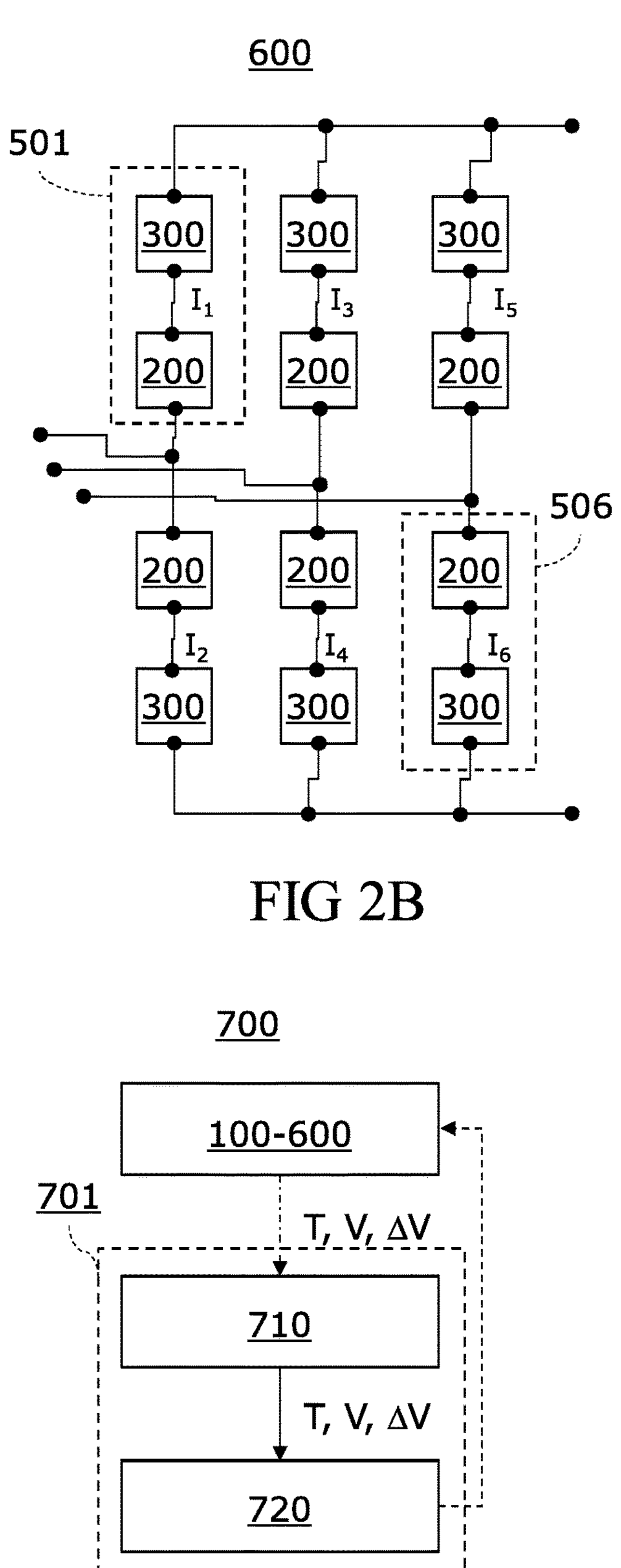
FIG 2B
FIG 2C

3000

POWER COMPONENT AND SYSTEM WITH THE POWER COMPONENT

TECHNICAL FIELD

Embodiments of the present invention relate to power components, in particular to power fuses and power semiconductor devices, to modules and systems with power components and related methods.

BACKGROUND

In power electronics, power semiconductors capable of switching large currents and/or operating at higher voltages as well as corresponding semiconductor fuses are widely used for different purposes, for example in amplifiers, rectifiers and converters. Used power semiconductor diodes and power semiconductor switches are often capable to operate at voltages differences of more than several 100 V, and/or to handle large currents, for example currents of at least several Amperes within the same semiconductor piece or semiconductor body. To further increase current handling capability, several power semiconductors may be coupled in parallel. For safety reasons, the power semiconductor(s) may be protected by semiconductor fuse(s).

Depending on load, the temperature of the power semiconductors (semiconductor bodies) and/or the fuse bodies may vary during operation. Accordingly, electronic properties of the devices like current-voltage characteristic, forward voltage drop of a diode and switching properties of semiconductor switches may change during operation. This may even lead to current imbalances between parallelly coupled power semiconductors. Likewise, temperature may change operational parameters of a fuse such as resistance and voltage drop at given current, and thus its breaking capacity.

Reliably measuring temperature and other parameters of devices in high power/high voltage applications during operation is complicated and/or costly. This may be due to the desired adaptation of the sensors to the (physical) conditions under which they have to work without significant impact on the device operation.

For example, fiber optical sensors are in principle suitable for measurements under high voltage conditions, but are often relatively large (fiber coils). Further, a plurality of different sensors may be desired. Due to the corresponding large number of optical fibres, the set-up may become more complicated. This may also make assembly and maintenance work more difficult. In addition, measuring and evaluating measured data may be complex. Furthermore, an additional (optical) interface may be required.

Thus, there is a need to further improve characterizing power components during operation.

SUMMARY

In view of the above, a power component, a power module, a system, and methods according to the claims are provided.

According to an embodiment of a power component, the power component includes two electric terminals, a component housing, a main component at least partially surrounded by the component housing, connected with the two terminals, and configured to carry a power current flowing between the two electric terminals, and a sensor and emitter unit which is configured to measure a value of a physical quantity characterizing an operating state of the main component, and to emit an electromagnetic signal, in which the measured value of the physical quantity is encoded. The sensor and emitter unit includes an antenna for emitting the electromagnetic signal. The antenna is spaced apart from the main component and is arranged in, on and/or at the component housing.

Since the antenna is spaced apart from the usually conductive main component, neither the transmission/reception properties of the antenna are significantly (negatively) influenced by the main component, nor does the antenna have a significant influence on the properties of the main component. Further, the measured value of the physical quantity can be read out contactlessly due to using an antenna for emitting the electromagnetic signal.

This results in a number of further advantages. In particular, the general setup, especially the wiring of power modules and systems using one or more of those power components can remain unchanged. Even a large number of respect measured values characterizing the operating state of the main component of one, several or even a large number of power components maybe read out this way in a simple and cost-efficient manner. Note that the sensor and emitter units may comparatively small and/or manufactured using existing technology in large numbers and at comparatively low costs, respectively. Further, the transmitted measured values may be (subsequently) further analyzed. In particular, the transmitted measured values may be used for condition-based monitoring and/or protecting the power component(s), for collecting lifetime data of the power component(s) and typically statistical analysis, for adapting or even optimizing the operation of the power component, and/or even for adapting or even optimizing the design of the power component(s).

The electromagnetic signal is typically a radio frequencies signal, for example an ultra-high frequency (UHF) radio signal, i.e. in the frequency range between 300 megahertz (MHz) and 3 gigahertz (GHz).

The term "high voltage", as used in this application, shall embrace ac voltages and dc voltages of at least about 600 V, more typically of at least about 1 kV or even at least about 5 kV.

The terms "high current" and "power current", as used in this application, shall embrace ac currents and dc currents of at least about 10 A, more typically of at least about 50 A or even at least about 100 A or 1 kA.

The term "high power", as used in this application, shall embrace an electric power of at least about 2 kW, more typically of at least about 5 kW or even at least about 15 kW.

Likewise, the term "power component", as used in this application, shall embrace an electric power of at least about 2 kW, more typically of at least about 5 kW or even at least about 15 kW.

Accordingly, a rated current of the main component is at least about 10 A and/or a rated power of the main component is at least about 2 kW.

Further, the power component is typically a high voltage component.

In particular, a rated voltage of the main component is typically at least about 600 V, more typically at least about 680 V, or even at least about 1 kV or even about 5 kV.

The power component may be configured to control the power current, in particular to amplify, switch and/or to break the power current.

In particular, the power component may be a power semiconductor device, in particular a vertical power semiconductor device, or a power fuse, typically a respective so-called semiconductor fuse, i.e. a fuse adapted for protecting a power semiconductor device against overload and/or short circuits. The breaking capacity (maximum current that can safely be interrupted by the fuse) may e.g. correspond to ten times the rated current of the power semiconductor device the fuse adapted for.

The power semiconductor device may be implemented as a power semiconductor diode, a power semiconductor transistor and/or a power semiconductor switch and/or may include one or more power semiconductor diodes and/or one or more power semiconductor switches, in particular respective power transistors such as a power thyristor, a power MOSFET or a power IGBT.

The main component of the power semiconductor diodes and the power semiconductor switches typically include a respective (structured) semiconductor body or die. The semiconductor body or die may include a rectifying junction functionally coupled between the two electric terminals, in particular a pn-junction. Depending on device type, the semiconductor body or die may also include several pn-junctions. Likewise, the two electric terminals may also include more than two terminals, for example two power terminals, such as an anode and a cathode terminal (aa e.g. in embodiments referring to diodes and/or thyristors), and a switching terminal, such as a gate terminal for controlling and/or switching a current between the two power terminals (as e.g. in embodiments referring to MOSFETs and/or thyristors).

The main component of a power fuse typically includes or is formed by an electrically conductive element, in particular a calibrated conductor. The electrically conductive element may be surrounded by a filler and enclosed by a housing and a fuse body, respectively. In addition, the power fuse may include an auxiliary switch for indicating and/or remote signaling of fuse-tripping.

The sensor and emitter unit is typically a low power unit. In the following the sensor and emitter unit is also referred to as sensing and emitting unit.

The term “low power”, as used in this application, shall embrace an electric power of at most about 5 W, more typically of at most about 2 W or even at most about 1 W.

Accordingly, the rated power of the sensor and emitter unit is at most 5 W, more typically of at most about 2 W or even at most about 1 W.

This allows for operating the sensor and emitter unit over longer times without recharging or exchanging an internal electrical power source.

Typically, the sensor- and emitter unit includes a low power emitter, in particular a low power transponder for bidirectional communication with a reader.

The low power transponder may be a respective Bluetooth transponder or RFID-transponder, in particular an active RFID tag or even a passive RFID tag.

Further, the sensor and emitter unit may be provided by one or more RFID-sensors or one or more Bluetooth-sensors.

In addition to low costs, RFID tags provide the further advantage of allowing small size which facilitate incorporating them into power components.

Passive RFID tags have the additional advantage that they do not require an internal power source as they can be powered by the electromagnetic energy transmitted from an RFID reader.

Even further, a sensor and emitter unit having a Bluetooth-transponder or RFID-transponder is may already by design be configured to additionally encode an identifier for the power component into the electromagnetic signal. This may facilitate the later evaluation of the transferred measured values.

Alternatively or in addition, the sensor and emitter unit may be configured to store several measured values of the physical quantity at least temporally, and to encode several measured values of the physical quantity into the electromagnetic signal, typically together with a respective measuring time.

Further, the sensor and emitter unit may include a sensor unit and an emitter unit functionally connected with the sensor unit, typically in a wired connection, and including or at least connected with the antenna.

The sensor unit is typically configured to convert an analog input signal representing the physical quantity into a digital value, to store the digital value, to process the digital value and/or transfer the digital value and/or the processed digital value to the emitter unit.

The emitter unit may even be spaced apart from the sensor unit. This may facilitate measuring and sending the measured value(s), as the sensor unit may be arranged closer to a measuring point and the corresponding digital value(s) may be safely transferred to the emitter unit arranged at least close to the antenna even under noisy conditions.

The sensor and emitter unit may also include two or more sensor units functionally coupled with one emitter unit.

Alternatively, the power component may include two or more sensor and emitter units.

The sensor and emitter unit(s) may include and/or implement at least two sensors each of which is configured to measure values of a respective physical quantity characterizing the operating state of the main component. For example, sensor and emitter unit(s) may be configured to measure two or more temperature values (also referred to as temperatures).

In particular, the sensor and emitter unit may be configured to measure values of different physical quantities each characterizing the operating state of the main component.

For example, the sensor and emitter unit may be configured to measure a temperature of the main component, a temperature of one or even of each of the two electric terminals, a voltage of one or even of each of the two electric terminals, and/or a voltage drop across the main component and the two terminals, respectively.

The antenna is typically at least substantially flat and/or implemented as a coil antenna.

Further, the antenna may be arranged at an outer side or surface of the component housing. This is because the transmission and receiving conditions are usually particularly good there.

At least the antenna is typically attached to the component housing, for example attached to an outer surface of the component housing.

In particular in embodiments referring to power component with one or more RFID tags and RFID-sensors, respectively, as sensor and emitter unit, the sensor and emitter unit may simply be glued to the component housing.

The component housing typically includes or is even made of a dielectric or a ceramic.

The component housing may substantially enclose the main component, and typically includes respective openings, ducts or vias for the two electric terminals, and optionally for electrical wires for connecting the sensor and emitter unit with one or more measuring points at the main component, with the electric terminals and/or even with one or more measuring terminals provided by the main component.

For example, the measuring terminals may be in electric contact with an integrated structure allowing for temperature measurements, for example a respective integrated resistive structure arranged close to a pn-junction of the main component, close to a center of a semiconductor body of the main component or a center of the fuse body.

In this regard it is noted that junction temperature is typically particularly important for characterizing the operating state of semiconductor devices. For fuses, temperature at the terminals and/or core temperature of fuse body may be particularly important for characterizing the operating state.

The term "housing", as used in this application, shall embrace the term "casing".

In embodiments referring to power semiconductor devices as power components, the main component is typically at least substantially shaped as a cylinder, more typically at least substantially shaped as a typically flat right circular cylinder, in particular shaped as a (semiconductor) wafer disc. Likewise, the electric terminal(s) may be at least substantially shaped as a respective cylinder and/or the component housing may be at least substantially shaped as a hollow cylinder, typically as corresponding right hollow circular cylinder.

Further, a diameter of the main component and/or a semiconductor body of the main component is at least about two inch, typically in a range from about two inch to about 6 inch.

The semiconductor body typically includes a rectifying junction.

In a cross-section, in particular a cross-section parallel to main surface(s) formed by a top base and a bottom base, respectively, of an at least substantially cylindrically shaped semiconductor body, the rectifying junction may extend at least substantially through the semiconductor body and/or may be orientated at least substantially parallel to the main surface(s).

Further, the rectifying junction may be functionally connected between the two electric terminals, and/or configured to carry a power current between the two electric terminals.

The rectifying junction may in particular be a PN junction formed between a p-type semiconductor region and an n-type semiconductor region of the semiconductor body.

Typically, each of the p-type semiconductor region and the n-type semiconductor region is in ohmic contact with and/or at least substantially covered by one of the two electric terminals.

The sensor and emitter unit may be configured to measure a temperature of the rectifying junction and/or a core temperature of the semiconductor body.

For this purpose, the power component may have an integrated resistive structure in (ohmic) contact with the sensor and emitter unit, and arranged at or close to the rectifying junction, and/or an integrated resistive structure in (ohmic) contact with the sensor and emitter unit, and arranged at or close to a center of the semiconductor body, in particular with respect to and/or at or close to a cylinder axis of an at least substantially cylindrically shaped semiconductor body.

Further, the power semiconductor device may be a press pack semiconductor device or a press semiconductor device.

In embodiments referring to power fuses as power components, the component housing typically provides a fuse body.

The main component of a power fuse may also be at least substantially shaped as a (right) cylinder, but typically not as circular cylinder. The power fuse may in particular be of a square body design. The electric terminals of a power fuse may have as flush end design.

A resistive structure in (ohmic) contact with the sensor and emitter unit may be arranged at or close to a center of the fuse body, in particular a center with respect to a longitudinal axis and/or a cylinder axis of the fuse body and/or the main component, and/or arranged at or close to the main component, in particular at or close to a lateral surface of the main component.

According to an embodiment, a power module includes at least two power components as explained herein, for example a plurality of respective components.

Typically, the power components are pairwise connected with each other.

More particular, the power module may include two or more respective power semiconductor devices at least pairwise connected in parallel or in series, for example two or more respective power thyristors connected in parallel. The power module may even include a plurality of respective power semiconductor devices which are at least pairwise connected in parallel and/or in series, for example up to 24 or even more power thyristors at least pairwise connected in parallel.

Alternatively or in addition, the power module may include one or more pairs of a power semiconductor device and a power fuse connected in series.

Alternatively or in addition, the power module may include a first submodule with a first power semiconductor device and a first power fuse connected in series, and a second submodule connected with the first submodule and having a second power semiconductor device and a second power fuse connected in series.

The power module may form or be part of a power electronic device such as a power converter, in particular a power rectifier or a power inverter.

According to an embodiment a system includes one or more a power components as explained herein or includes one or more power modules as explained herein, as well as a receiving unit configured to receive the electromagnetic signal(s) from the power component(s), and to decode the measured value(s) of the physical quantity(ies), and an evaluation unit connectable with the receiving unit, and configured to use the decoded measured value(s) of the physical quantity(ies) for analyzing the operating state of the main component of the power component(s) and/or an operating state of the power module(s).

The receiving unit may be implemented as a respective reader, for example an active RFID-reader.

Further, the receiving unit may include a network interface for connecting the receiving unit to a data network, in particular a network interface which is configured to transceive digital signals and/or digital data between the receiving unit and the data network, in particular a global data network, for example a respective a wireless interface (e.g. a Wi-Fi-interface).

The data network may be an Ethernet network using TCP/IP such as LAN, WAN or Internet. The data network may comprise distributed storage units such as Cloud. Depending on the application, the Cloud can be in form of public, private, hybrid or community Cloud.

The receiving unit is typically operatively connected to the network interface for carrying out commands received from the data network. The commands may include a control command for controlling the receiving unit as well as the power component(s). The commands may include a status request. In response to the status request, or without prior status request, the receiving unit may be adapted for sending a status information to the network interface, and the network interface is then adapted for sending the status information over the network. The commands may include an update command including update data. In this case, the receiving unit may be adapted for initiating an update in response to the update command and using the update data.

Likewise, the evaluation unit may also include a corresponding network interface for connecting the evaluation unit to the data network.

Accordingly, the evaluation unit may be remote to the receiving unit.

The evaluation unit is typically configured to use the decoded measured value(s) for estimating an aging status of the power component(s), and/or for determining a warning message, a maintenance recommendation and/or a control parameter for the power component(s).

In particular, the evaluation unit may be configured to use the decoded measured value(s) for determining at least one of a current strength of the power current and a current distribution between at least two of the power components. These values may e.g. be used to determine control parameter(s) for the power component(s), in particular control parameter(s) referring to the current strength and/or switching characteristics, and/or maintenance recommendations.

The evaluation unit may even be configured to influence the current distribution using the control parameter(s).

Further, the evaluation unit may be configured to decode the measured values of different physical quantities of the power component, and/or to decode the measured value(s) of a temperature, a voltage and/or a voltage drop of the power component.

Even further, the evaluation unit may be configured to determine a current temperature dependent property of the power component, in particular an electric resistance, an electric resistivity an electric conductance and/or an electric conductivity of the power component.

According to an embodiment of a method, the method includes using a sensor and emitter unit of a power component configured to carry a power current, in particular a sensor and emitter unit of a power component as explained herein to measure a value of a physical quantity characterizing an operating state of a main component of the power component, and using an antenna of the sensor and emitter unit to emit an electromagnetic signal in which the measured value of the physical quantity is encoded.

The method typically further includes receiving the electromagnetic signal and decoding the encoded value.

Furthermore, the method may further include using the decoded value to determine the operating state, to change a control parameter for the power component, to estimate an aging status of the power component, and/or to determine a warning message and/or a maintenance recommendation for the power component.

According to an embodiment of a method for manufacturing a power component, in particular a power component as explained herein, the method includes providing a main component configured to carry a power current, and a sensor and emitter unit configured to measure a value of a physical quantity characterizing an operating state of the main component and to emit an electromagnetic signal, in which the measured value of the physical quantity is encoded, and at least partly encasing the main component with a dielectric, and attaching the sensor and emitting unit in, at, and/or on the dielectric so that an antenna of the sensor and emitting unit is spaced apart from the main component.

For example, the main component may be provided with a module housing by encasing with the dielectric. Thereafter, the sensor and emitter unit may be attached to the module housing and dielectric, respectively, for example glued to an outer side of the module housing. Thereafter, the sensor and emitter unit may be wired to with measuring points at the terminals and/or of the main component.

Other embodiments include (non-volatile) computer-readable storage media or devices, and one or more computer programs recorded on one or more computer-readable storage media or computer storage devices. The one or more computer programs can be configured to perform particular operations or processes by virtue of including instructions that, when executed by one or more processors of a system, in particular a system as explained herein, cause the system to perform the operations or processes.

According to an embodiment of a method, in particular a monitoring method, the method includes providing a power module as explained herein, receiving from at least one of the sensor and emitter units of the at least two power components of the power module one or more respective measured values of a physical quantity, and further processing the received measured value(s).

Further processing typically incudes at least one of the following processes: determining a temperature, determining a temperature distribution, monitoring a temperature, monitoring a temperature distribution, determining a current flow, determining a current flow distribution, monitoring the current flow, monitoring the current flow distribution, and detecting an imbalance of the temperature distribution, and/or imbalance of the temperature distribution the current flow distribution, for example a respective imbalance that may be harmful when lasting longer than a predefined time.

Determining the current flow and/or the current flow distribution may include taking into account a given electric resistance between the electric terminals of a power fuse of the power module, in particular a respective cold resistance of the power fuse.

The method may, typically after detecting (potentially harmful) imbalance(s), temperature(s) and/or currents, further include estimating an ageing of the power module, raising a warning (message), scheduling a maintenance or a repair for the power module, determining at least one updated control parameter for operating the power module, and/or using the at least one updated control parameter for controlling the power module.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1A illustrates a cross-section through a power component according to an embodiment;

FIG. 1B illustrates a view on a power component according to an embodiment;

FIG. 1C illustrates a view on a power component according to an embodiment;

FIG. 1D illustrates a cross-section through a power component according to an embodiment;

FIG. 1E illustrates a cross-section through a power component according to an embodiment;

FIG. 2A is a schematic diagram of a power module according to an embodiment;

FIG. 2B is a schematic diagram of a power module according to an embodiment;

FIG. 2C is a block diagram of a system according to an embodiment;

FIG. 2D is a flow chart of a method for monitoring a power component according to embodiments;

FIG. 2E is a flow chart of a method for manufacturing a power component according to embodiments;

DETAILED DESCRIPTION

Figure 3A:
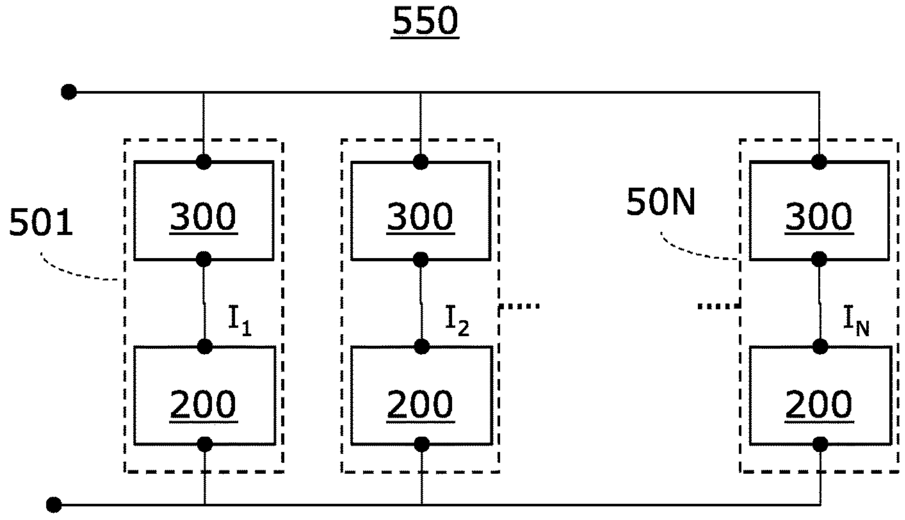
FIG. 3A is a schematic diagram of a power module according to an embodiment.

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

Figures 1A, 1B, 1C, 1D, 1E:
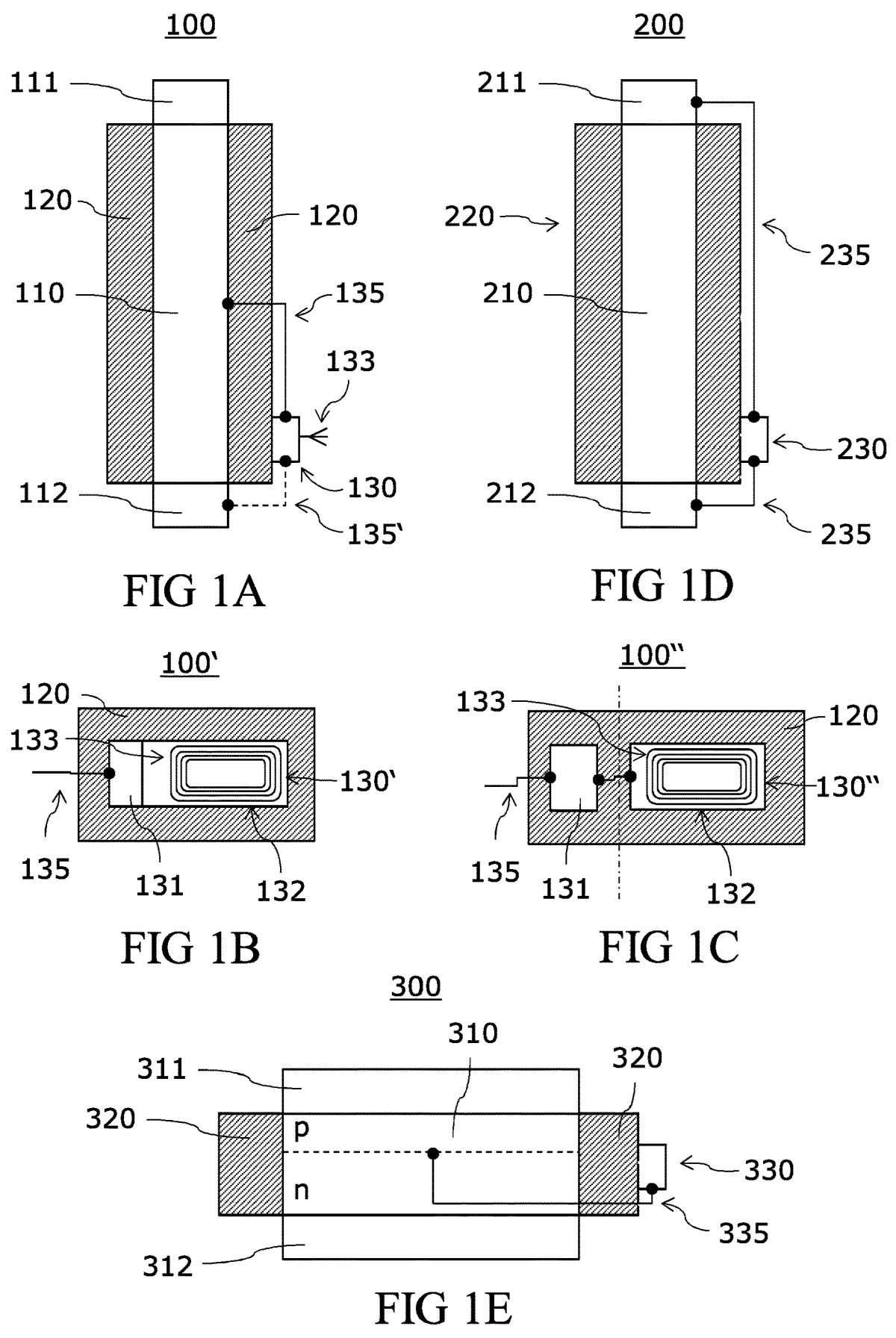

FIG. 1A shows a schematic cross-section through a power component 100. In the exemplary embodiment, power component 100 is a power fuse having an electrically conductive element 110 as main functional component which is laterally surrounded by a ceramic fuse body forming the component housing 120. Fuse body 120 may e.g. be shaped as a hollow cylinder. The electrically conductive element is in electric contact with two electric terminals 111, 112, and may carry a current between the terminals 111, 112 and break the current above a predetermined threshold current. A sensor and emitter unit 130 having an antenna 133 for emitting electromagnetic signals is arranged on and attached to an outer surface of fuse body 120. As indicated by a wiring 135, the sensor and emitter unit 130 may be connected with measuring tips arranged next to or even at the surface of the electrically conductive element 110. Note that any wiring in the drawings may correspond to a wire, a pair of wires or even more than two wires.

Accordingly, sensor and emitter unit 130 may measure core temperature values of the electrically conductive element 110 during device operation, and emit the core temperature values encoded into an electromagnetic signal via antenna 133 to a reader (not shown). For sake of clarity, further optional details of power fuse 100 such as a filler are also not shown in FIG. 1A.

This allows contactlessly transferring the measured temperature values and remote further processing to at least characterize the operating state of power component 100.

As indicated by the dashed wiring 135', sensor and emitter unit 130 may alternatively or in addition measure temperature values of terminal 112 (or even both terminals) and emit the terminal temperature value(s) in encoded form with the electromagnetic signal.

The respective temperature values may be measured for a temperature range from about −40° C. to about 125° C. (for measuring core temperature) or from about −40° C. to about +85° C. (for measuring terminal temperature), and/or with an accuracy of at least 0.5° C.

FIG. 1B shows a schematic view of a section of a power component 100'. Power component 100' is similar to power component 100 explained above with regard to FIG. 1A and may also be a power fuse. However, the sensor and emitter unit 130' of power component 100' is implemented as an RFID-temperature sensor. RFID-temperature sensor 130' has a sensor unit 131 with an appropriate measuring circuitry, and an emitter unit 132 with a flat coiled antenna 133.

As shown in FIG. 1C illustrating a schematic view of a section of a power component 100", the sensor unit 131 and the emitter unit 132 of RFID-sensor 130" may be spaced apart from each other, but are functionally coupled with each other, typically via a wired connection.

FIG. 1D shows a schematic cross-section through a power component 200. Power component 200 is typically similar to the power components 100 to 100" explained above with regard to FIGS. 1A to 1C and typically also a power fuse, in particular a respective semiconductor fuse. However, in the exemplary embodiment of FIG. 1D, the sensor and emitter unit 230 attached to fuse body (component housing) 220 is connected via respective wires 235 with both electrical terminals 211, 212.

The sensor and emitter unit 230 is typically configured to measure the voltages at the terminals 211, 212. Further, the sensor and emitter unit 230 may be configured to determine a voltage drop between the two terminals 211, 212.

As explained above, the sensor and emitter unit 230 may be implemented as a Bluetooth-sensor or an RFID-sensor, for example as an RFID voltage measuring sensor, in particular a respective battery free RFID tag in the exemplary embodiment.

More particular, the sensor and emitter unit 230 may be configured to measure the AC voltage drop across semiconductor fuse 200 and its main component (conductive element) 211, respectively, even under high power conditions/ in high power applications, in particular in high power rectifier applications (see also FIGS. 2A, 2B).

The voltage measurement may e.g. be used to monitor current distribution (online) in those applications. Alternatively or in addition, information of the operational state of fuse 200 may be determined from the measured values.

The sensor and emitter unit 230 may be configured to measure AC voltage pulses across the fuse 200 and calculate respective RMS values that may be averaged. In this regard it is noted that the measuring voltage may not be a sinus waveshape, for example even pulsed DC voltage may be used, and can be distorted.

Further, the sensor and emitter unit 230 is typically protected in order not to create any arc when the (AC) fuse 200 is broken, and full voltage drop of e.g. 2 kV AC applies across fuse 200 and therefore the sensor and emitter unit 230. However, this typically depends on the specifications of the power semiconductor device to which semiconductor fuse 200 is to be connected in series.

For example, the sensor and emitter unit 230 may fulfil one or more or even all of the following specifications:

Rated measuring voltage: 80 . . . 250 mV;

Rated frequency: 50/60 Hz;

Measurement mode: RMS, average optional;

Measurement update cycle rate: ≤10 s;

Isolation voltage input/output: 5 kV;

Temperature measurement range: −40 . . . ≥125° C.;

Type: RFID;

Frequency range for communication with a reader: UHF; and

Size: several square centimeters, typically less than 25 $cm^2$.

The sensor and emitter unit 230 may be placed similarly to an auxiliary contact (not shown) on the fuse body 220.

Further, the circuitry of sensor and emitter unit 230 is typically enclosed by a non-conducting housing material. This is because it is typically used under high voltage (HV) conditions, for example in an HV electronic stack. Further the sensor and emitter unit 230 is typically used in an environment with a lot of metal (stainless steel, aluminum, copper) in the near.

Optionally, sensor and emitter unit 230 is further configured for temperature measurements as explained above with respect to FIGS. 1A-1C, in particular for measuring the terminal (connection) temperature.

FIG. 1E shows a schematic cross-section through a power component 300 implemented as a vertical power semiconductor device, more particular as a power semiconductor diode. This indicated by the dashed line representing a PN junction between a p-type semiconductor region and an n-type semiconductor region of the semiconductor body 310, each of which is in ohmic contact with one of the two power terminals 311, 312.

In the exemplary embodiment, semiconductor body 310 is laterally enclosed by a dielectric component housing 320 which may e.g. be substantially ring-shaped (when seen from above).

Further, a sensor and emitter unit 330 is arranged on and at a lateral outer side of housing 320.

As indicated by the wiring 335, the sensor and emitter unit 330 is typically functionally connected with the semiconductor body 310 and configured to measure a core temperature of semiconductor body 310, more particular a temperature at least close to the PN junction of power diode 300.

For this purpose, an integrated resistive structure arranged at or close to the rectifying junction and at or close to a center of the semiconductor body with respect to a central axis of semiconductor body 310 which is typically at least substantially perpendicular to the PN junction (cylinder axis).

Alternatively or in addition, the sensor and emitter unit 330 may be configured to measure the voltages at the power terminals 311, 312 and/or to determine a voltage drop between the power terminals 311, 312. These measurements may e.g. be used to directly measure current imbalances between power diodes connected in parallel.

Furthermore, the sensor and emitter unit may be configured to measure the temperature at different points in the semiconductor body. Accordingly, a temperature profile may be determined during device operation. In particular in embodiments referring to power MOSFETs and power IGBTs typically having a plurality of respective cells, temperature differences between the cells may provide information on current distribution between the cells and even on ageing.

In further embodiments, the sensor and emitter unit may alternatively or in addition be configured to measure values of one or more other physical quantities characterizing the operating state of the respective device.

The sensor and emitter unit 330 may also be at least partly arranged in component housing 320. For example, the sensor and emitter unit 330 may be cast into a casting compound used for encasing semiconductor body 310.

FIG. 2A shows a schematic diagram of a power module 500 formed by two power components 200, 300 connected in series, namely a power semiconductor diode 300 as explained above with regard to FIG. 1E and a corresponding semiconductor fuse 200 as explained above with regard to FIG. 1D.

For sake of clarity, the respective the sensor and emitting units which may be used to measure and contactlessly transmit values for the core temperature of power semiconductor diode 300 and the terminal temperatures and the voltage drop across the fuse 200, respectively, are not shown in FIG. 2A. These values may be used to monitor power module 500 or even several power modules during operation.

The latter is illustrated in FIG. 2B showing a schematic diagram of an exemplary 3-phase power rectifier 600 made of six power modules 501-506 each of which typically corresponds to a power module 500 as explained with regard to FIG. 2A, and FIG. 3A showing a schematic diagram of an exemplary power rectifier 550 made N power modules 501-50N (N being a whole positive number that may be larger than 3, 7 or even 15) each of which typically corresponds to a power module 500 as explained with regard to FIG. 2A. The illustrated power modules 501-506, 501-50N may be considered as respective submodules each comprising and/or being made of a power semiconductor device and a power fuse connected in series.

Based on the temperature measurements and voltage drop measurements of the power fuses 200, respective currents $I_1$-$I_6$ flowing through each of the six modules 501-506 (in FIG. 2A) and respective currents $I_1$-$I_N$ flowing through each of the N modules 501-50N (in FIG. 3A), respectively, may be determined with high accuracy as the voltage drops across each of the fuses 200 are measured and the resistance of each of the fuses 200 may corrected in accordance with the measured corresponding fuse temperature.

Additionally measuring the temperature of the power diodes 300 is not required for determining a current distribution within power rectifiers 550, 600, but may be used for long-term monitoring of the power devices, estimating ageing and/or scheduling maintenance or repair.

In other words, it may be sufficient if only the power diodes 200 are provided with respective sensor and emitter units.

In other embodiments, it may be sufficient to only provide the power semiconductor devices with the respective sensor and emitter units.

Figure 3B:
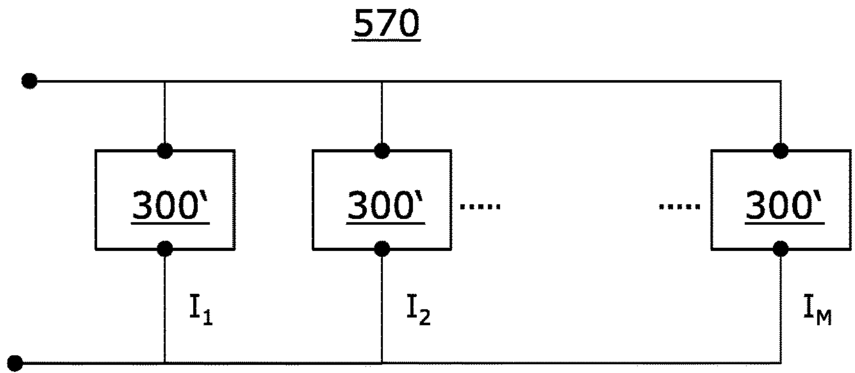
FIG. 3B is a schematic diagram of a power module according to an embodiment.

This is illustrated in FIG. 3B showing a schematic diagram of an exemplary power electronic device 570 made of M typically at least substantially identical power modules 300' with M being a whole positive number larger than 1, 3, 7 or even 15. Each power module 300' may corresponds to a power diode 300 as explained with regard to FIG. 1E. In this embodiment, power electronic device 570 may be a power rectifier. In embodiments referring to power electronic switching devices, each power module 300' may e.g. be a power thyristor.

Based e.g. on temperature measurements using the sensor and emitter units of the power modules 300', an imbalance of the temperatures of the power module 300' may be determined. Based thereon and e.g. assuming at least substantially equal properties of the power modules 300', an imbalance of the currents $I_1$-$I_M$ flowing through the M modules 501-50M may be determined.

In some applications it may even be sufficient to provide one of the power modules with a respective sensor and emitter unit.

As illustrated in FIG. 2C a monitoring and/or control system 701 for the power component(s) 100-300 and the power module(s) 500-600 as explained above with regard to FIGS. 1A to 2B typically has a receiving unit 710 configured to receive the electromagnetic signals from the power component(s) 100-300, to decode the measured value(s) of the physical quantity(ies) T, V, ΔV, and an evaluation unit 720 connected with the receiving unit 710, and configured to the determine or even analyze the respective operating state(s) based on the decoded measured value(s) of the physical quantity(ies) T, V, ΔV.

Receiving unit 710 and evaluation unit 720 may be formed by one device or may be remote to each other and/or connected with each other via a data network.

Depending on the determined/analysed operating state of one or more of the power modules, evaluation unit 720 may e.g. raise a warning message, and/or determine a control parameter for the power component(s) and use the determined control parameter for operating the power module(s). The latter is illustrated in FIG. 2C by the dashed arrow.

The system 700 formed by monitoring and/or control system 701 and the power component(s) 100-300 and the power module(s) 500-600 may allow both controlling and long-term monitoring of the power component(s).

System 700 may perform the method 1000 illustrated in the flowchart of FIG. 2D.

In a first block 1100, a sensor and emitter unit of a power component, in particular a sensor and emitter unit of a power component as explained herein is used to measure a value of a physical quantity characterizing an operating state of the power component.

Thereafter, an electromagnetic signal in which the measured value of the physical quantity is encoded is emitted via an antenna of the sensor and emitter unit in a block 1200.

Typically, the electromagnetic signal is received, and the encoded value is decoded in a block 1300.

The blocks 1100 to 1300 may be performed several times, for example in regular intervals, and/or for several power components, typically in parallel.

The encoded value(s) is(are) typically used for determining and/or characterizing the operating state, determining a warning message, a maintenance recommendation and/or a control parameter for the power component(s).

FIG. 2E shows a flow chart of a method 2000 for manufacturing a power component, in particular a power component as explained herein.

In a block 2100, a main component configured to carry a power current, and a sensor and emitter unit are provided.

In a block 2200, the main component is provided with a dielectric component housing and the sensor and emitting unit. This is done such that an antenna of the sensor and emitting unit is attached with the component housing and spaced apart from the main component, and that the sensor and emitter unit can measure a value of a physical quantity which characterises an operating state of the main component and emit via the antenna an electromagnetic signal, in which the measured value of the physical quantity is encoded.

Figure 3C:
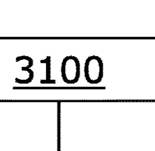
FIG. 3C is a flow chart of a method according to embodiments.
Figure 3C:
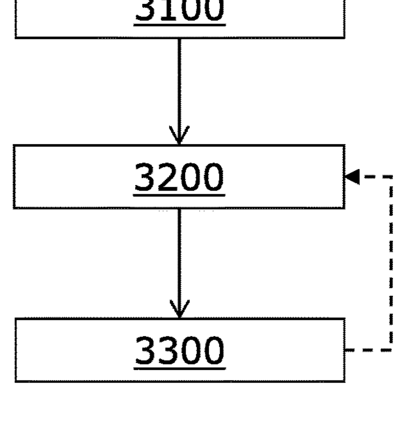

FIG. 3C shows a flow chart of a method 3000.

In a first block 3100, a power module as explained herein may be provided.

In a block 3200, a respective measured value of one or more physical quantities is/are received from one, typically from two or even all of the sensor and emitter units of the power components of the power module.

The measured value may in particular refer to a temperature of the respective main component, a voltage of at least one of the two respective electric terminals, or a voltage drop across the main component and the two terminals, respectively.

Thereafter, the received measured value(s) is/are further processed in a block 3300.

As indicated by the dashed arrow in FIG. 3C, blocks 3200, 3300 may be repeated (several times), for example periodically.

Further processing may include one or more of the following steps:

- determining a temperature distribution of the main components,
- monitoring the temperature distribution,
- determining a current flow through one or more of the main components,
- determining a current flow distribution between the main components,
- monitoring the current flow and/or the current flow distribution, and
- detecting an imbalance of the temperature distribution and/or the current flow distribution.

For example, the (provided) power module may be a power module 570 as explained above with respect to FIG. 3B, or a power module 550, 600 as explained above with respect to FIGS. 2B, 3A. In embodiment referring to power module 550, 600, the current flow and/or the current flow distribution may be determined taking into account a given electric resistance between the electric terminals of the power fuses, in particular a respective cold resistance of the power fuses.

Alternatively or in addition, further processing may include one or more of the following steps:

- estimating an ageing of the power module or of one or more power components thereof,
- scheduling a maintenance or a repair for the power module,
- determining at least one updated control parameter for operating the power module, and
- using the at least one updated control parameter for controlling the power module.

For example, a switching characteristics and/or a current strength of one or more controllable power components of the power module and the power electronic device, respectively, may be amended to better balance the current and/or the temperature distribution. This may increase the lifetime.

Estimating the ageing may be based on monitored peak loads and/or integrated loads of the power module and the power components thereof, respectively.

The monitored loads may refer thermal loads, current loads and combinations thereof.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as “first”, “second”, and the like, are also used to describe various elements, regions, sections, etc. and are also not intended to be limiting. Like terms refer to like elements throughout the description.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor device, comprising:

two electric terminals;

a component housing;

a main component at least partially surrounded by the component housing, connected with the two terminals, and configured to carry a power current flowing between the two electric terminals; and a sensor and emitter unit configured to measure a value of a physical quantity characterizing an operating state of the main component, and to emit an electromagnetic signal, in which the measured value of the physical quantity is encoded, the sensor and emitter unit comprising an antenna for emitting the electromagnetic signal, the antenna being spaced apart from the main component and arranged in, on and/or at the component housing, wherein a rated current of the main component is at least about 10 A, wherein the power semiconductor device is a high voltage component, wherein a rated voltage of the main component is at least about 600 V, and/or wherein a rated power of the main component is at least about 2 kW.

2. The power semiconductor device of claim 1, wherein the power component is configured to control the power current and/or to break the power current.

3. The power semiconductor device of claim 1, wherein the power semiconductor device is a vertical power semiconductor device, and/or comprises a power semiconductor diode and/or a power semiconductor switch, in particular a power thyristor, a power MOSFET or a power IGBT, and/or wherein the power semiconductor device is one of a power semiconductor diode and a power semiconductor switch, in particular a power thyristor.

4. The power semiconductor device of claim 1, wherein the sensor and emitter unit comprises a low power transponder, wherein the sensor and emitter unit is configured to store several measured values of the physical quantity at least temporally, wherein the sensor and emitter unit is configured to encode several measured values of the physical quantity into the electromagnetic signal, typically together with a respective measuring time, and/or wherein the sensor and emitter unit is configured to encode an identifier for the power component into the electromagnetic signal.

5. The power semiconductor device of claim 4, wherein the low power transponder is a Bluetooth transponder or an RFID-transponder, in particular an active RFID tag or a passive RFID tag.

6. The power semiconductor device of claim 1, wherein the sensor and emitter unit comprises a sensor unit and an emitter unit comprising the antenna, wherein the emitter unit is spaced apart from the sensor unit, wherein the sensor unit is configured to convert an analog input signal representing the physical quantity into a digital value, store the digital value, process the digital value and/or transfer the digital value and/or the processed digital value to the emitter unit, wherein the sensor and emitter unit is provided by one or more RFID-sensors, and/or wherein a rated power of the sensor and emitter unit is at most 5 W.

7. The power semiconductor device of claim 1, wherein the sensor and emitter unit comprises two sensors each of which is configured to measure a respective physical quantity characterizing the operating state of the main component, wherein the sensor and emitter unit is configured to measure different physical quantities each characterizing the operating state of the main component, and/or wherein the sensor and emitter unit is configured to measure a temperature of the main component, a voltage of at least one of the two electric terminals, and/or a voltage drop across the main component and/or the two terminals.

8. The power semiconductor device of claim 1, wherein the main component is at least substantially shaped as a cylinder, wherein at least one of the two electric terminals is at least substantially shaped as a cylinder, wherein the component housing is at least substantially shaped as a hollow cylinder, wherein the main component comprises a semiconductor body comprising a rectifying junction, wherein a diameter of the main component and/or the semiconductor body is at least two inch, typically in a range from two inch to 6 inch, and/or wherein the power semiconductor device comprises a press pack design or a press design.

9. The power semiconductor device of claim 8, wherein the sensor and emitter unit is configured to measure a temperature of the rectifying junction and/or a core temperature of the semiconductor body.

10. The power semiconductor device of claim 9, wherein the rectifying junction extends, in a cross-section, at least substantially through the semiconductor body, wherein the rectifying junction is functionally connected between the two electric terminals, wherein the rectifying junction is configured to carry a power current between the two electric terminals, and/or wherein the rectifying junction is a PN-junction formed between a p-type semiconductor region and an n-type semiconductor region of the semiconductor body.

11. The power semiconductor device of claim 10, wherein each of the p-type semiconductor region and the n-type semiconductor region is in ohmic contact with and/or at least substantially covered by one of the two electric terminals.

12. The power semiconductor device of claim 8, further comprising an integrated resistive structure arranged at or close to the rectifying junction, and/or an integrated resistive structure arranged at or close to a center of the semiconductor body.

13. The power semiconductor device of claim 1, wherein the component housing comprises a dielectric and/or a ceramic, wherein the component housing substantially encloses the main component, wherein the antenna is a substantially flat and/or a coil antenna, and/or wherein the antenna is arranged at an outer side of the component housing.

14. A power module, comprising at least two power components, the at least two power components being at least pairwise electrically connected with each other, each of the at least two power components comprising:

two electric terminals;

a component housing;

a main component at least partially surrounded by the component housing, connected with the two terminals, and configured to carry a power current flowing between the two electric terminals; and a sensor and emitter unit configured to measure a value of a physical quantity characterizing an operating state of the main component, and to emit an electromagnetic signal, in which the measured value of the physical quantity is encoded, the sensor and emitter unit comprising an antenna for emitting the electromagnetic signal, the antenna being spaced apart from the main component and arranged in, on and/or at the component housing;

at least one of the at least two power components being a power semiconductor device;

wherein the power module comprises at least one of:

the power semiconductor device and a power fuse connected in series;

a first submodule comprising a first power semiconductor device and a first power fuse connected in series; and a second submodule connected with the first submodule and comprising a second power semiconductor device and a second power fuse connected in series.

15. The power module of claim 14, wherein at least one of the two terminals of a first power component of the at least two power components is electrically connected with one of the two terminals of a second power component of the at least two power components, and/or wherein the power module is a part of or forms a power converter, in particular a power rectifier and/or comprises two power semiconductor devices connected in parallel.

16. The power module of claim 14, wherein the power fuse comprises a resistive structure arranged at or close to a center of the fuse body, in particular a center with respect to a longitudinal axis and/or a cylinder axis of the fuse body and/or the main component, and/or at or close to the main component, in particular at or close to a lateral surface of the main component, wherein the component housing of the power fuse provides a fuse body, wherein the main component of the power fuse is at least substantially shaped as a cylinder, wherein the power fuse comprises a square body design, and/or wherein the electric terminals of the power fuse comprise as flush end design.

17. The power module of claim 14, wherein the sensor and emitter unit of the power semiconductor device comprises two sensors each of which is configured to measure a respective physical quantity characterizing the operating state of the main component, wherein the sensor and emitter unit is configured to measure different physical quantities each characterizing the operating state of the main component, and/or wherein the sensor and emitter unit is configured to measure a temperature of the main component, a voltage of at least one of the two electric terminals, and/or a voltage drop across the main component and/or the two terminals.

18. A system, comprising:

a power component, the power component being a power semiconductor device comprising:

two electric terminals;

a component housing;

a main component at least partially surrounded by the component housing, connected with the two terminals, and configured to carry a power current flowing between the two electric terminals; and a sensor and emitter unit configured to measure a value of a physical quantity characterizing an operating state of the main component, and to emit an electromagnetic signal, in which the measured value of the physical quantity is encoded, the sensor and emitter unit comprising an antenna for emitting the electromagnetic signal, the antenna being spaced apart from the main component and arranged in, on and/or at the component housing;

a receiving unit configured to receive the electromagnetic signal from the power component, and to decode the measured value of the physical quantity; and an evaluation unit connectable with the receiving unit, and configured to use the decoded measured value of the physical quantity for analyzing the operating state of the main component of the power component and/or an operating state of a power module comprising the power component;

wherein the evaluation unit is configured to use the decoded measured value for estimating an aging status of the power component, and/or for determining at least one of a warning message, and a control parameter for the power component, wherein the evaluation unit comprises a network interface for connecting the evaluation unit to a data network, and/or wherein the receiving unit comprises a network interface for connecting the receiving unit to the data network.

19. The system of claim 18, wherein the network interface for connecting the evaluation unit to a data network is configured to transceive digital signals and/or digital data between the evaluation unit and the data network.

20. The system of claim 19, wherein the evaluation unit is configured to at least one of:

use the decoded measured value for determining at least one of a current strength of the power current and a current distribution between two of the power components;

determine a control parameter for at least one of the power components, in particular a control parameter referring to the current strength;

influence the current distribution;

decode measured values of different physical quantities of the power component;

decode the measured value of a temperature, a voltage and/or a voltage drop of the power component; and determine a current temperature dependent property of the power component, in particular an electric resistance, an electric resistivity, an electric conductance, and/or an electric conductivity of the power component.

* * * * *